US010366932B2

(12) United States Patent
Lin et al.

(10) Patent No.: US 10,366,932 B2
(45) Date of Patent: Jul. 30, 2019

(54) METHOD AND SYSTEM FOR WET CHEMICAL BATH PROCESS

(71) Applicant: Taiwan Semiconductor Manufacturing Co., Ltd., Hsinchu (TW)

(72) Inventors: Chien-Chiang Lin, Tainan (TW); Chung-Chen Yu, Tainan (TW); Shih-Chuan Lin, Tainan (TW); Zhi-Xioung Hu, Tainan (TW); Chih-Hung Hsueh, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

(21) Appl. No.: 15/617,203

(22) Filed: Jun. 8, 2017

(65) Prior Publication Data
US 2018/0151456 A1    May 31, 2018

Related U.S. Application Data

(60) Provisional application No. 62/426,955, filed on Nov. 28, 2016.

(51) Int. Cl.
*H01L 21/66* (2006.01)
*H01L 21/311* (2006.01)
*H01L 21/67* (2006.01)

(52) U.S. Cl.
CPC ........ *H01L 22/26* (2013.01); *H01L 21/31111* (2013.01); *H01L 21/67057* (2013.01); *H01L 21/67086* (2013.01); *H01L 21/67253* (2013.01)

(58) Field of Classification Search
None
See application file for complete search history.

(56) References Cited

U.S. PATENT DOCUMENTS

2017/0062231 A1* 3/2017 Sato .................. H01L 21/67086
2018/0151456 A1* 5/2018 Lin ................... H01L 21/67057

* cited by examiner

*Primary Examiner* — Jack S Chen
(74) *Attorney, Agent, or Firm* — McClure, Qualey & Rodack, LLP

(57) ABSTRACT

A method for performing a wet chemical process over a semiconductor wafer is provided. The method includes moving the semiconductor wafer into a chemical solution. The method further includes detecting the concentration of at least one substance in the chemical solution at a plurality of preset time points. The method also includes removing the semiconductor wafer from the chemical solution, when the concentration of the substance is maintained at a fixed approximate value.

20 Claims, 10 Drawing Sheets

METHOD AND SYSTEM FOR WET CHEMICAL BATH PROCESS

PRIORITY CLAIM AND CROSS-REFERENCE

This application claims the benefit of U.S. Provisional Application No. 62/426,955, filed on Nov. 28, 2016, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Integrated circuits are typically manufactured on a single semiconductor wafer. The individual dies are singulated by sawing the integrated circuits along a scribe line. The individual dies are then packaged separately, in multi-chip modules, or in other types of packaging, for example.

During the manufacturing of the semiconductor devices, various processing steps are used to fabricate integrated circuits on a semiconductor wafer. For example, semiconductor devices are formed on a semiconductor substrate using several wet chemical processing operations. The wet processing operations may include cleaning operations, stripping operations and etching operations in which the chemicals of a chemical bath react with a material being etched or removed.

Although existing devices and methods for wet chemical processing operations have been generally adequate for their intended purposes, they have not been entirely satisfactory in all respects. Consequently, it would be desirable to provide a solution for performing wet chemical processing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
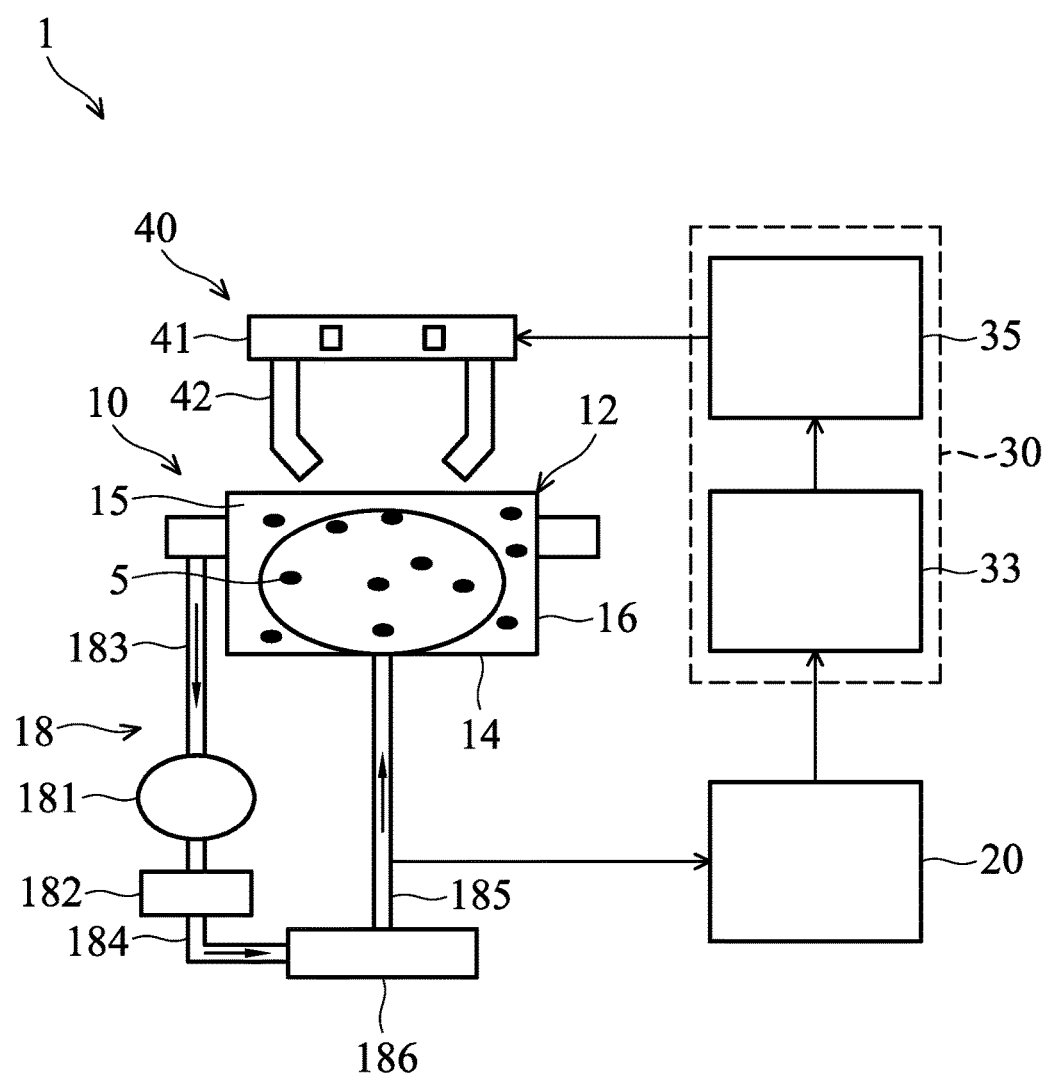
FIG. 1 shows a schematic diagram of a system for performing a wet chemical process, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be performed before, during, and after the method, and some of the operations described can be replaced or eliminated for other embodiments of the method.

FIG. 1 shows a schematic diagram of a system 1 for performing a wet chemical process over a semiconductor wafer 5, in accordance with some embodiments. In some embodiments, the system 1 includes a wet bench 10, a detecting module 20, a control module 30, and a driving module 40. The elements of the system 1 can be added to or omitted, and the invention should not be limited by the embodiment.

The wet bench 10 includes a tank 12 and a circulation loop 18. The tank 12 serves as the processing bath, i.e., the bath in which semiconductor wafers 5 are processed. In some embodiments, the tank 12 is formed by a bottom wall 14 and a sidewall 16 which is joined perpendicular to the bottom wall 14 forming a fluid-tight enclosure. The bottom wall 14 and the sidewall 16 can be constructed of a corrosion-resistant material such as panels of stainless steel or steel panels coated with a corrosion-resistant material such as Teflon.

The circulation loop 18 is connected to the tank 12 to operate a circulation process. In some embodiments, the circulation loop 18 includes a pump 181, a filter 182, and a heater 186. The pump 181 is connected to the sidewall 16 of the tank 12 via an upstream conduit 183. The heater 186 is connected to bottom wall 14 of the tank 12 via a downstream conduit 185. The pump 181 and the filter 182 are connected to each other by a connecting conduit 184. The filter 182 is positioned on the connecting conduit 184.

The detecting module 20 is used to detect the concentration of a particular substance, such as Silica, in the chemical solution 100. In some embodiments, the detecting module 20 includes an external concentration meter and is connected to a point of the circulation loop 18 which is located downstream of the heater 186 so as to increase the precision of the detected result. However, it should be appreciated that many variations and modifications can be made to embodiments of the disclosure. The detecting module 20 may be connected to any position of the wet bench 10.

The control module 30 is configured to control the process of the driving module 40 in response to the detected results from the detecting module 20. In some embodiments, the control module 30 includes a CIM (computer integrated manufacturing) device 33 and a host computer 35. The CIM device 33 is electrically connected to the detecting module 20. The detecting results from the detecting module 20 are transmitted to the CIM device 33 for analyzing. The CIM device 33 is electrically connected to the host computer 35. The analyzed results from the CIM device 33 are transmitted to the host computer 35. The host computer 35 is electrically connected to driving module 40 and is configured to issue a trigger signal to the driving module 40 to remove the semiconductor wafer 5 in response to the analyzed results from the CIM device 33.

The driving module 40 is configured for transporting the semiconductor wafer 5. In some embodiments, the driving module 40 includes a controller 41 and a number of pairs of blades 42. Each pair of blades 42 is connected to the controller 41 in such a manner that the two blades 42 are able to move toward or away from one another so as to hold and position the semiconductor wafer 5.

Figure 2:
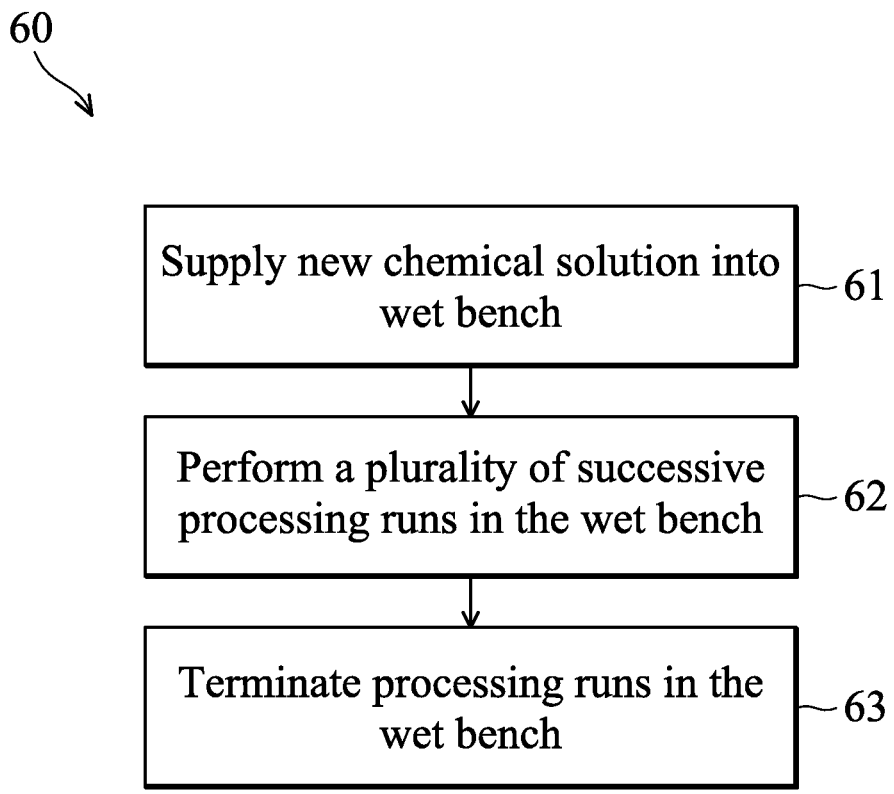
FIG. 2 shows a flow chart illustrating a method for performing a wet chemical process for a number of processing runs, in accordance with some embodiments.

FIG. 2 is a flow chart illustrating a method 60 for performing a wet chemical process over one or more semiconductor wafers 5, in accordance with some embodiments. For illustration, the flow chart will be described to accompany the schematic view shown in FIG. 1. Some of the described stages can be replaced or eliminated in different embodiments. Additional features can be added to the semiconductor device structure. Some of the features described below can be replaced or eliminated in different embodiments.

The method 60 begins with an operation 61, in which a new chemical solution 15 is supplied into the wet bench 10.

In some embodiments, the wet bench 10 contains a chemical solution 15 such as hot phosphoric acid. In one particular embodiment, the hot phosphoric acid, $H_3PO_4$, may be maintained at about 150° C. In other exemplary embodiments, the hot phosphoric acid in the wet bench 10 may be maintained at a temperature within a range of about 70° C. to about 160° C., or at other suitable temperatures.

In some embodiments, a circulation process is performed via a circulation loop (such as circulation loop 18). During the circulation process, the chemical solutions 15 are drawn from the tank 12 via the circulation loop 18 and back into the tank 12 for a period of time. In some embodiments, after the circulation process, a substantially homogenous liquid chemical solution 15 is provided in the tank 12. In some embodiments, in the circulation process, particles in the chemical solution 15 are filtered by the filter 182 of the circulation loop 18. In some embodiments, in the circulation process, the chemical solution 15 in the tank 12 is heated to a desired temperature for processing. In some embodiments, the circulation process is continuously operated except that a maintenance process is performed.

The method 60 continues with an operation 62, in which a number of processing runs are performed. In each processing run, a wet chemical process is performed over a number of semiconductor wafers 5, such as twenty-four semiconductor wafers 5, in the chemical solution 15 to etch or stripe at least one material by the use of chemical solution 15 in the wet bench 10. The method for performing each processing run will be described in detail with reference to FIG. 4. Afterwards, the method 60 continues with an operation 62 after the complete of the processing runs.

Figure 3:
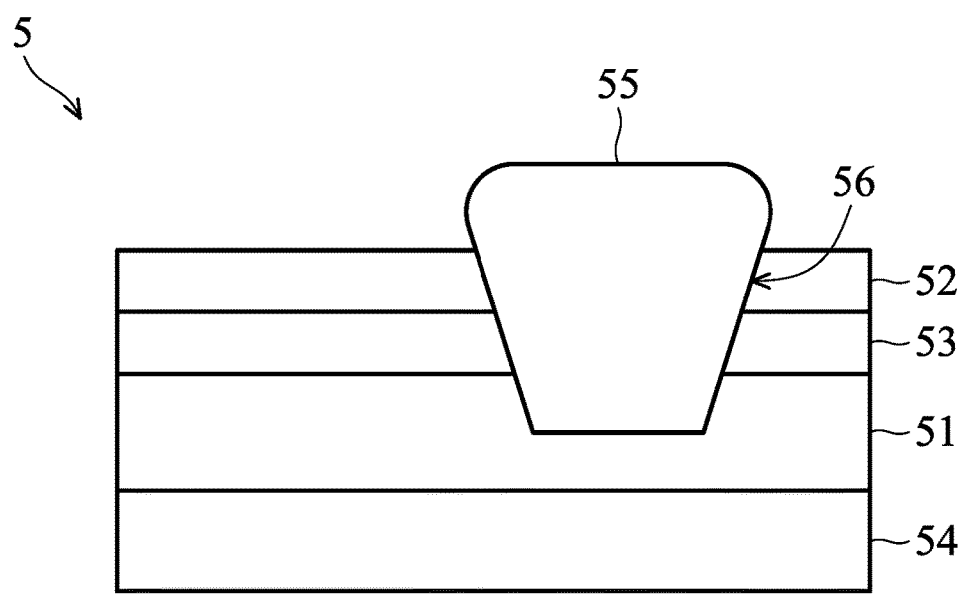
FIG. 3 shows a cross-section view of a semiconductor wafer before a wet chemical process, in accordance with some embodiments.

FIG. 3 shows a cross-sectional schematic view of the semiconductor wafer 5 before wet chemical process, in accordance with some embodiments. In some embodiments, the semiconductor wafer 5 includes a substrate 51, a first film 52, a second film 53, a third film 54 and a STI structure 55.

The substrate 51 may made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The second film 53 is formed on the front surface the silicon substrate 51. The second film 53 may include a pad silicon oxide layer and be formed by a thermal oxidation process. In some embodiments, the second film 53 has a thickness ranging from about 110 angstroms. The first film 52 is formed on the second film 53. The first film 52 may include silicon nitride layer and be formed by a low pressure chemical vapor deposition (LPCVD) process. In some embodiments, the first film 52 has a thickness ranging from about 900 angstroms.

A recess 56 extends from the first film 52 via the second film 53 to the substrate 51. The STI structure 55 is formed in the recess 56. The STI structure 55 may include silicon oxide to separate and isolate active areas on a semiconductor wafer from each other. The third film 54 is formed on the back surface of the substrate 51. The third film 54 may include silicon nitride layer and be formed by a low pressure chemical vapor deposition (LPCVD) process. In some embodiments, the third film 54 has a thickness ranging from about 1125 angstroms.

Figure 4:
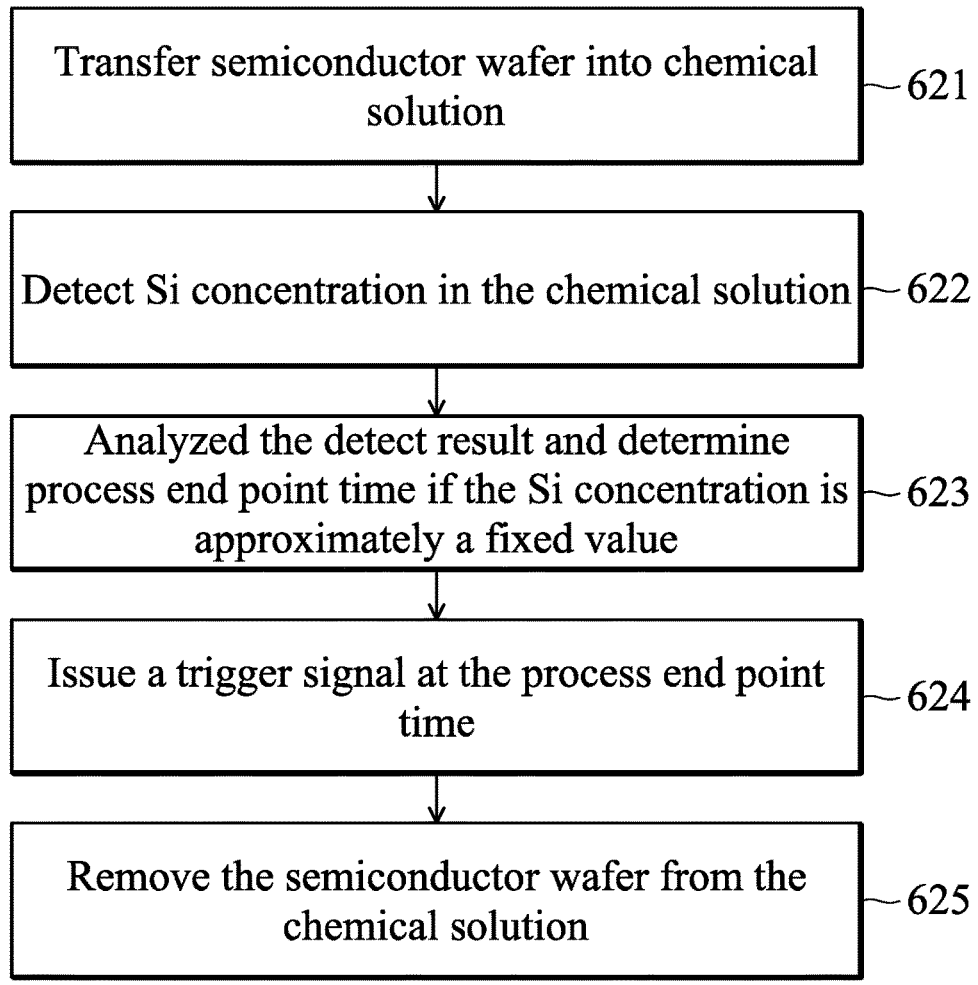
FIG. 4 shows a flow chart illustrating stages in a processing run, in accordance with some embodiments.
Figure 5A:
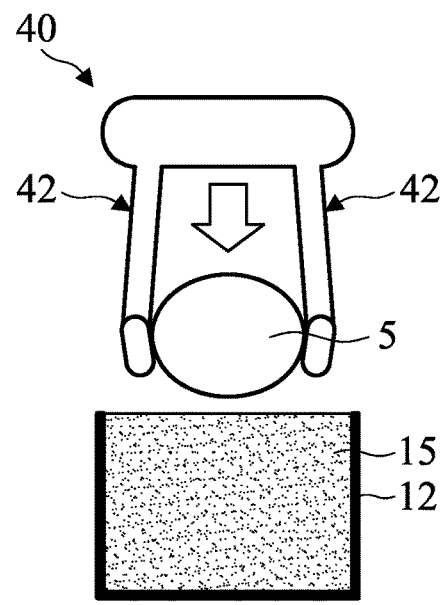
FIG. 5A shows a schematic view of one stage of a method for performing a wet chemical process as a wafer is being moved into a chemical solution, in accordance with some embodiments.

In some embodiments, as shown in FIG. 4, each processing run begins with operation 621, in which the semiconductor wafers 5 are transferred into the chemical solution in the wet bench 10. In some embodiments, as shown in FIG. 5A, before the semiconductor wafer 5 enters the wet bench 10, one or more semiconductor wafers 5 (only one semiconductor wafer 5 is shown in FIGS. 5A-5E) are transported by the driving module 40. Each semiconductor wafer 5 is securely held by two blades 42 of the driving module 40.

Figure 5B:
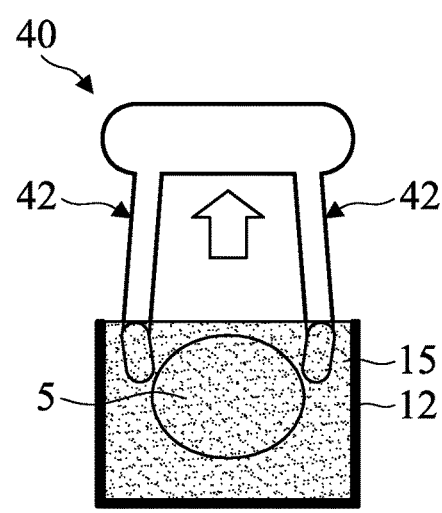
FIG. 5B shows a schematic view of one stage of a method for performing a wet chemical process as a wafer is immersed in a chemical solution, in accordance with some embodiments.
Figure 5C:
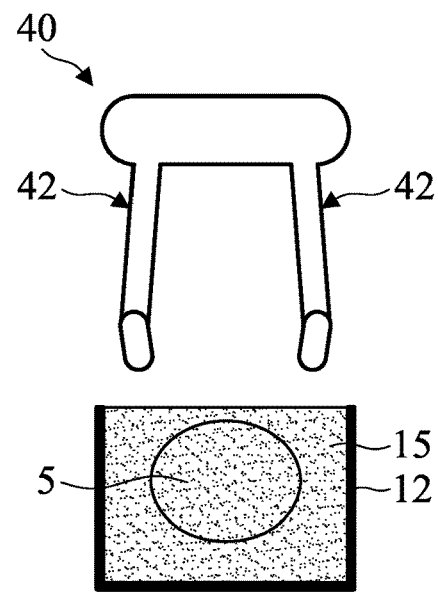
FIG. 5C shows a schematic view of one stage of a method for performing a wet chemical process as a driving module is stand in an idle state, in accordance with some embodiments.

Afterwards, as shown in FIG. 5B, the driving module 40 is lowered to bring the semiconductor wafer 5 into the chemical solution 15. In some embodiments, when the semiconductor wafer 5 is in the wet bench 10, the driving module 40 is disengaged with the semiconductor wafer 5 and is moved up into a position that is higher than the liquid surface. During the processing time period, the driving module 40 may be driven to transport another semiconductor wafer 5 to other processing device. Alternatively, the driving module 40 may be idle during the processing time period as shown in FIG. 5C.

When the semiconductor wafers 5, as shown in FIG. 3, stay in the chemical solution 15, the first film 52 and the third film 54 are removed from the wet chemical process. In addition, a reaction of the second film 53 and the chemical solution 15 is initialized, once the second film 53 is exposed to the chemical solution 15 to reduce the thickness of the second film 53.

The thickness of the second film 53 may be decreased with the increase of immersion time of the semiconductor wafers 5 in the chemical solution 15. In some embodiments, when the second film 53 become too thin subsequent semiconductor processing steps as well as the final die integrity may be adversely affected as the dies undergo layer-by-layer fabrication through a series of further material deposition and removal steps. In addition, die failure rates may increase in subsequent wafer level and known good die testing. As a result, it is preferable to maintain the thickness within a desired range.

Figure 6:
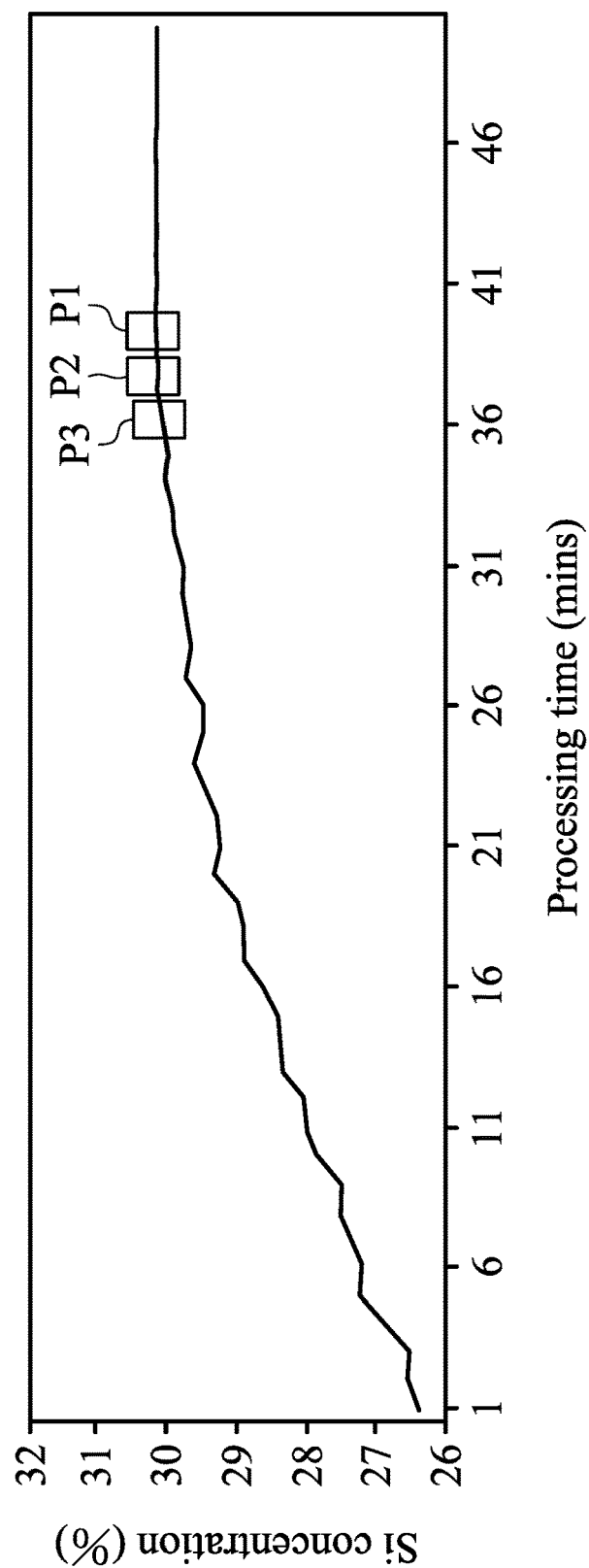
FIG. 6 shows the relationship between the silica concentration in the chemical solution and the reaction time during a single wet chemical process.

FIG. 6 shows the relationship between the silica concentration in the chemical solution and the reaction time during a single process run. As shown in FIG. 6, during the wet chemical process of the semiconductor wafers 5, the Silica concentration (Si concentration) is gradually increased during the wet chemical process and maintains a fixed value after the silicon nitride, such as the first and third films 52 and 54, are removed. That is, stable Si concentration indicates the completion of the etching of the first and third films 52 and 54. Therefore, real-time monitoring of the Si concentration in the chemical solution 15 is conducted through operations 622 and 623 in each processing run to decide on a process end point time when the semiconductor wafer 5 is removed from the chemical solution 15.

Specifically, in operation 622, Si concentration is detected by the detecting module 20. In some embodiments, the detecting module 20 takes in a small amount of chemical solution 15 from the circulation loop 18 of the wet bench 10 and detects the concentration (weight percent) of silica in the chemical solution 15. The detection of the chemical solution 15 is performed periodically during each processing run. In one exemplary embodiment, Si concentration in the chemical solution is detected at a number of preset time points, and the time interval between two sequential preset time points is about one minute.

However, it should be appreciated that many variations and modifications can be made to embodiments of the disclosure. The time interval between two sequential preset times may be smaller than one minute. In some embodiments, the time interval between two sequential preset times is relatively small, such that the chemical solution 15 is nearly continuously monitored by the detecting module 20.

In operation 623, the detection results from detecting module 20 are analyzed by the control module 30 and a process end point time is determined when the Si concentration is approximately fixed. In some embodiments, the CIM device 33 calculates two concentration differences of the silica between each two sequential preset time points of the three most recent preset time points. For example, as shown in FIG. 6, the concentration difference between the current preset time point P1 and the previous preset time point P2 is calculated. In addition, the concentration difference between the previous preset time point P2 and the preset time point P3 before the previous preset time point P2 is calculated.

Afterwards, the concentration differences are evaluated further to determine when Si concentration is maintained at a substantial fixed value. In some embodiments, a predetermined value of 0.03 is employed. Once both of the above-mentioned concentration differences are smaller than the predetermined value, the Si concentration is judged to be stable, and the current preset time point P1 is determined as the process end point time. Afterwards, an end point signal is issued to the host computer 35 from the CIM device 33 at the process end point time.

However, it should be appreciated that many variations and modifications can be made to embodiments of the disclosure. In some other embodiments, a concentration difference of the substance at the current preset time point P1 and at the previous preset time point P2 is calculated. When both concentration differences are smaller than the predetermined value, e.g., 0.02, the Si concentration is stable.

In operation 624, a trigger signal is alarmed by the control module 30 to actuate the driving module 40 at the process end point time. In some embodiments, once the host computer 35 receives the end point signal from the CIM device 33, the host computer 35 transmits a trigger signal to the controller 41 of the driving module 40 to actuate the movement of the driving module 40.

Figure 5D:
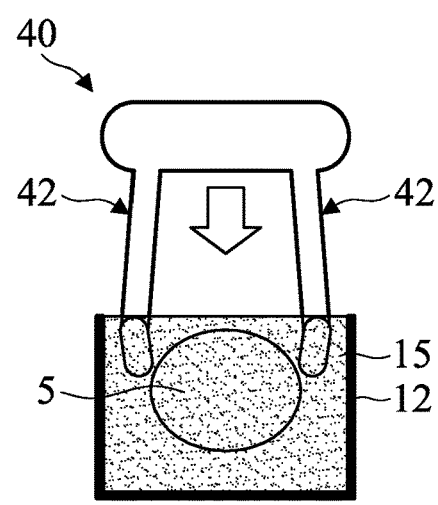
FIG. 5D shows a schematic view of one stage of a method for performing a wet chemical process as a driving module is being lowered to hold a wafer, in accordance with some embodiments.
Figure 5E:
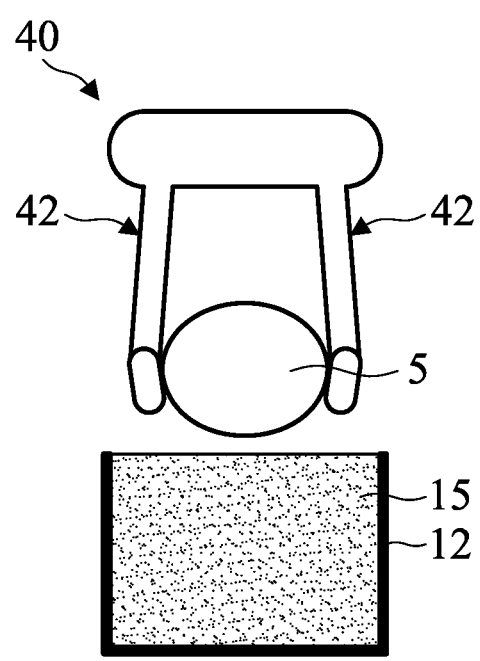
FIG. 5E shows a schematic view of one stage of a method for performing a wet chemical process as a wafer is being removed from a chemical solution, in accordance with some embodiments.

In operation 625, the semiconductor wafer 5 is removed from the chemical solution 15 by the driving module 40 in response to the trigger signal. In some embodiments, as shown in FIG. 5D, the driving module 40 is lowered to bring the semiconductor wafer 5 to leave the chemical solution 15. Afterwards, as shown in FIG. 5E, the semiconductor wafer 5 is held by the blades 42 of the driving module 40, and the driving module 40 is moved up to remove the semiconductor wafer 5 from the chemical solution 15.

After the processed semiconductor wafer 5 is removed from the chemical solution, successive processing runs are performed over the same semiconductor wafer 5 in the chemical solution 15.

Figure 7:
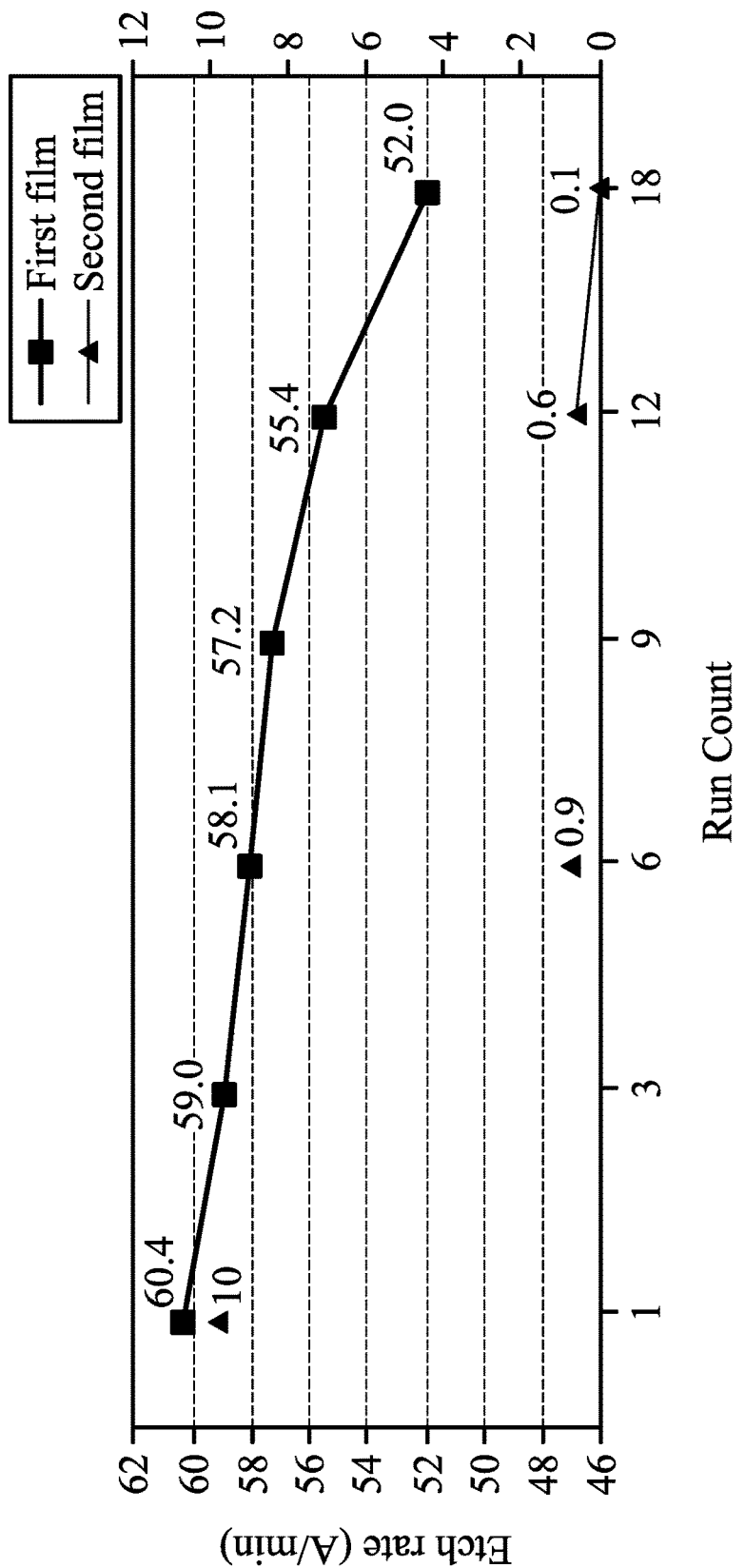
FIG. 7 shows a comparison of etch rate of a chemical solution relative to silicon nitride (SN) layer versus etch rate of a chemical solution relative to silicon oxide (OX) layer in each processing run.

FIG. 7 shows a comparison of etch rate of a chemical solution relative to silicon nitride (SN) layer versus etch rate of a chemical solution relative to silicon oxide (OX) layer in each processing run. After a number of processing runs are performed, the etch rate of the chemical solution 15 relative to silicon nitride (SN) layer is in significant decay. When the etch rate of chemical solution 15 relative to silicon nitride (SN) layer is outside a control limit, the method continues with operation 63, in which processing runs are terminated. The chemical solution may be exhausted from the wet bench 10 to a waste handling system (not shown in figures).

It should be noted that since real-time monitoring of the Si concentration is performed in each processing run, a decrease in the thickness of the silicon oxide layer, such as the second film 53 of the semiconductor wafer 5 shown in FIG. 3, is mitigated or avoided. Therefore, the semiconductor wafer 5 can be processed in the chemical solution 15 even if the etch rate of the chemical solution 15 relative to silicon oxide is relatively high. In some embodiments, the semiconductor wafer 5 is processed at the very beginning of the supply of the chemical solution 15 into the tank 12. As a result, the tool capacity of the wet bench 10 is extended.

Figure 8:
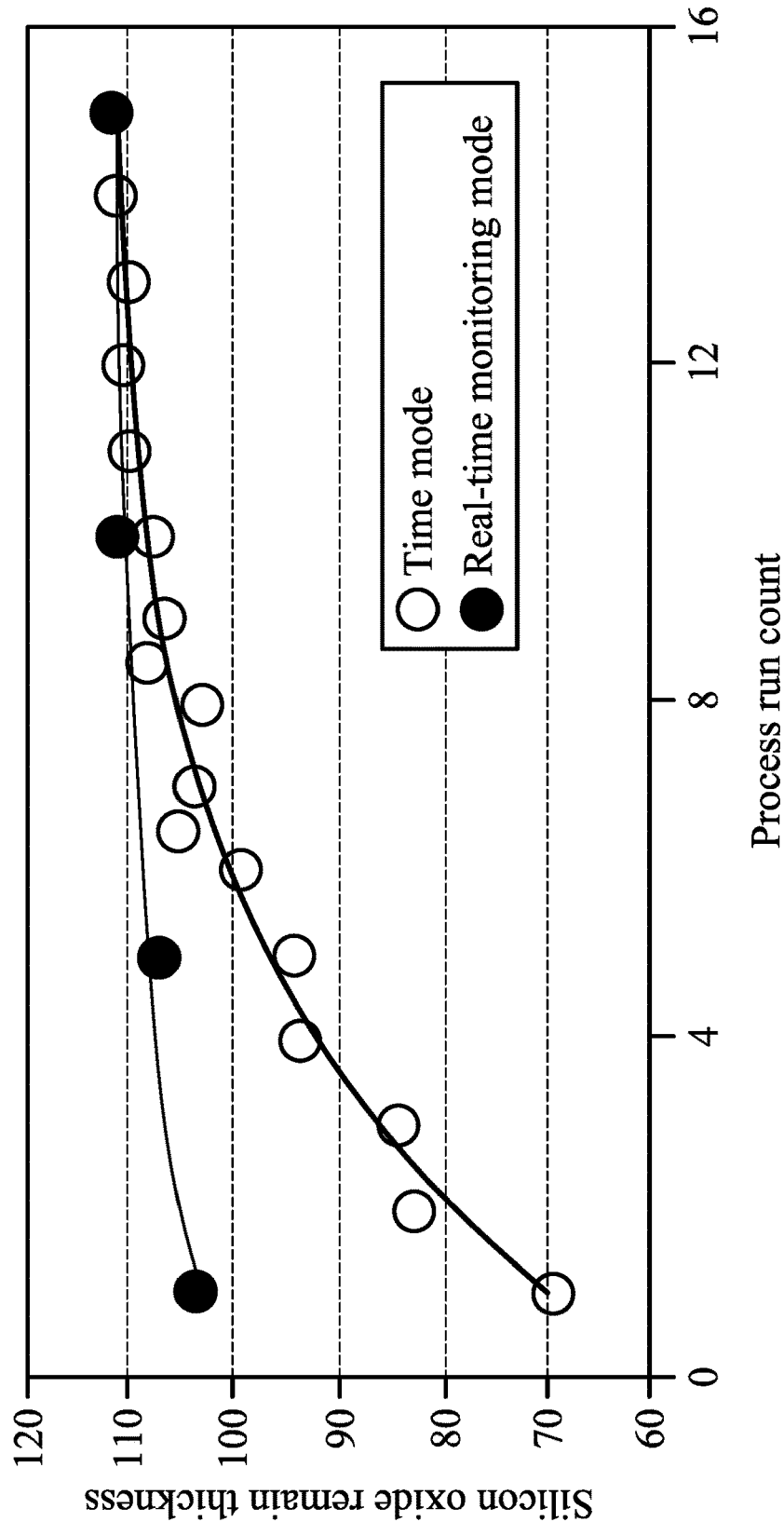
FIG. 8 shows a comparison of the thickness of the silicon oxide (OX) layer in a real-time monitoring mode that allows each processing run to adaptively adjust the processing time versus the thickness of the silicon oxide (OX) layer in a fixed time mode that performs each processing run by a fixed processing time.

As shown in FIG. 8, in the early processing run, the remaining thickness of the silicone oxide layer on the semiconductor wafers 5 which are processed by the above-mentioned method is remarkably thicker than the remaining thickness of the silicone oxide layer on the semiconductor wafers which are processed by a fixed processing time. Therefore, the uniformity in thickness from a wafer-to-wafer process in different processing runs is improved. In some embodiments, the thickness of the silicone oxide in the first of the processing runs thinner than the thickness of the silicone oxide in each of the following processing runs by 10%.

It is to be understood that, although phosphoric acid nitride removal is used as an example in the above-mentioned embodiment, the method and apparatus according to the present disclosure can be used in other wet chemical process as long as the concentration of a part of the substance in the chemical solution tends to be stable at the completion of the wet chemical process.

Embodiments of a system and methods for processing a semiconductor wafer involve detecting the concentration of a substance in a chemical solution which is going to be supplied to the semiconductor wafer. Since the wet chemical process is stopped at a process end point time which is determined by the detected result, the semiconductor wafer is efficiently processed. Therefore, the throughput of the semiconductor wafer is increased. Moreover, by controlling the process end point time, a reaction between the chemical solution and another component to be retained is mitigated or avoided. As a result, the production yield of the semiconductor wafer is improved.

In accordance with some embodiments, a method for performing a wet chemical process over a semiconductor wafer is provided. The method includes moving the semiconductor wafer into a chemical solution. The method further includes detecting the concentration of at least one substance in the chemical solution at a plurality of preset time points. The method also includes removing the semiconductor wafer from the chemical solution, when the concentration of the substance is maintained at a fixed approximate value.

In accordance with some embodiments, a method for performing a wet chemical process over a plurality of semiconductor wafers is provided. The semiconductor wafer each has a first film and a second film underlying the first film. The method includes providing a tank containing a chemical solution. The method also includes performing a plurality of successive processing runs in the tank, with each of the processing runs removing at least the first film on the semiconductor wafers. The method also includes during each processing run, periodically measuring Si concentration in the chemical solution. In addition, the method includes determining a process end point time of each processing run according to the measured Si concentration. The method further includes removing the wafer from the tank at the corresponding process end point times.

In accordance with some embodiments, a system for performing a wet chemical process over a plurality of semiconductor wafers is provided. The system includes a wet bench. The wet bench contains a chemical solution comprising hot phosphoric acid. The system also includes a detection module. The detection module is connected to the wet bench and configured to detect Si concentration in the chemical solution. The system further includes a control module. The control module is connected to the detection module and configured to receive and analyze the detection result from the detection module. Moreover, the system includes driving module. The driving module is connected to the control module and configured to remove the wafer in the wet bench in response to an trigger signal issued from the control module Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for performing a wet chemical process over a semiconductor wafer, comprising:
   immersing the semiconductor wafer into a hot phosphoric acid;
   detecting the concentration of Silica in the hot phosphoric acid at a plurality of preset time points;
   determining a process end point time at which the concentration of the Silica is maintained at approximately a fixed value; and
   removing the semiconductor wafer from the hot phosphoric acid at the process end point times.

2. The method as claimed in claim 1, further comprising calculating a concentration difference of the Silica at a first preset time point and at a second preset time point; and
   when the concentration difference is smaller than a predetermined value, removing the semiconductor wafer from the hot phosphoric acid, wherein the predetermined value is less than or equal to about 0.02.

3. The method as claimed in claim 1, further comprising calculating two concentration differences of the Silica between each two sequential preset time points of the three most recent preset time points; and
   when the two concentration differences are both less than a predetermined value, the semiconductor wafer is removed from the hot phosphoric acid, wherein the predetermined value is less than or equal to about 0.03.

4. The method as claimed in claim 1, wherein the time interval between two sequential preset time points is about one minute.

5. The method as claimed in claim 1, wherein the semiconductor wafer has a first film and a second film underlying the first film, and at least the first film on the semiconductor wafer is removed by the hot phosphoric acid;
wherein the first film formed on the semiconductor wafer comprises silicon nitride.

6. The method as claimed in claim 5, wherein the second film formed on the semiconductor wafer comprises silicon oxide.

7. The method as claimed in claim 1, further comprising providing a tank containing the hot phosphoric acid; and
when the semiconductor wafer is immersed in the hot phosphoric acid, performing a circulation process to draw the hot phosphoric acid from the tank and return the hot phosphoric acid back to the tank via a circulation loop connected to the tank.

8. The method as claimed in claim 7, wherein in the circulation process, the hot phosphoric acid is heated to a desired temperature for the wet chemical process by a heater of the circulation loop;
wherein the desired temperature is within a range of about 70° C. to about 160° C.

9. The method as claimed in claim 7, wherein the concentration of the silica is detected by detecting the concentration of the silica in a small amount of the hot phosphoric acid taken from the circulation loop.

10. A method for performing a wet chemical process over a plurality of semiconductor wafers, comprising:
performing a plurality of successive processing runs by sequentially immersing the semiconductor wafers into a hot phosphoric acid;
during each processing run, periodically measuring the concentration of Silica in the hot phosphoric acid;
determining a process end point time of each processing run at which the concentration of the Silica is maintained at approximately a fixed value;
removing the semiconductor wafers from the hot phosphoric acid at the process end point times.

11. The method as claimed in claim 10, wherein the concentration of the Silica in the hot phosphoric acid is detected at a plurality of preset time points in each of the processing runs.

12. The method as claimed in claim 11, further comprising calculating a concentration difference of the Silica at a first preset time point and at a second preset time point in each processing run; and
when the concentration difference is smaller than a predetermined value, the semiconductor wafer is removed from the hot phosphoric acid, wherein the predetermined value is less than or equal to about 0.02.

13. The method as claimed in claim 11, further comprising calculating two concentration differences of the Silica between each two sequential preset time points of the three most recent preset time points in each processing run; and
when the two concentration differences are both less than a predetermined value, the semiconductor wafer is removed from the hot phosphoric acid, wherein the predetermined value is less than or equal to about 0.03.

14. The method as claimed in claim 11, wherein the time interval between two sequential preset time points is about one minute.

15. The method as claimed in claim 10, wherein the semiconductor wafers each has a first film and a second film underlying the first film, and at least the first film on the semiconductor wafer is removed in each of the processing runs;
wherein the first film formed on the semiconductor wafer comprises silicon nitride.

16. The method as claimed in claim 15, wherein the second film formed on the semiconductor wafer comprises silicon oxide.

17. The method as claimed in claim 15, wherein the thickness of the second film in the first of the processing runs is thinner than the thickness of the second film in each of the following processing runs by 10%.

18. A method for performing a wet chemical process over a semiconductor wafer, comprising:
immersing the semiconductor wafer into a hot phosphoric acid;
detecting the concentration of Silica in the hot phosphoric acid at a plurality of preset time points, wherein the time interval between two sequential preset time points is smaller than one minute;
determining a process end point time by calculating two concentration differences of the Silica between each two sequential preset time points of the three most recent preset time points and judging the concentration of the Silica is maintained at approximately a fixed value when the two concentration differences are both less than a predetermined value that is less than or equal to about 0.03; and
removing the semiconductor wafer from the hot phosphoric acid at the process end point time.

19. The method as claimed in claim 18, further comprising providing a tank containing the hot phosphoric acid; and
when the semiconductor wafer is immersed in the hot phosphoric acid, performing a circulation process to draw the hot phosphoric acid from the tank and return the hot phosphoric acid back to the tank via a circulation loop connected to the tank.

20. The method as claimed in claim 18, wherein the hot phosphoric acid is maintained at about 150° C. during the wet chemical process.

\* \* \* \* \*